(12) United States Patent
Chung

(10) Patent No.: US 7,523,366 B2
(45) Date of Patent: Apr. 21, 2009

(54) STORAGE EFFICIENT MEMORY SYSTEM WITH INTEGRATED BIST FUNCTION

(75) Inventor: Shine Chien Chung, Taipei Hsien (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 210 days.

(21) Appl. No.: 11/298,127

(22) Filed: Dec. 9, 2005

(65) Prior Publication Data

US 2007/0136626 A1    Jun. 14, 2007

(51) Int. Cl.
    G11C 29/00    (2006.01)
    G11C 7/02     (2006.01)
    G01R 31/28    (2006.01)

(52) U.S. Cl. .................. 714/718; 714/733; 714/742; 365/201

(58) Field of Classification Search .............. 714/718, 714/733, 742; 365/201
See application file for complete search history.

(56) References Cited

U.S. PATENT DOCUMENTS

| | | | |
|---|---|---|---|
| 6,901,542 B2* | 5/2005 | Bartenstein et al. | 714/719 |
| 7,096,393 B2* | 8/2006 | Caty et al. | 714/718 |
| 2003/0115517 A1* | 6/2003 | Rutten | 714/718 |

* cited by examiner

*Primary Examiner*—Cynthia Britt
*Assistant Examiner*—John J Tabone, Jr.
(74) *Attorney, Agent, or Firm*—K & L Gates LLP

(57) ABSTRACT

A method and system conduct built-in-self-test (BIST) in a circuit under test. After allocating at least one memory segment with a predetermined size in at least one memory module as a test result module, the built-in-self-test is conducted for the circuit under test without testing the test result module. The test results are stored in the test result module.

20 Claims, 3 Drawing Sheets

STORAGE EFFICIENT MEMORY SYSTEM WITH INTEGRATED BIST FUNCTION

BACKGROUND

The present invention relates generally to memory tests, and more particularly to an improved Memory Built-In-Self-Test (MBIST) design or Logic Built-In-Self-Test (LBIST) design.

A memory chip is an integrated circuit (IC) made of millions of transistors and capacitors. There are a large variety of memory devices in the commercial world nowadays. There are types of memory known as ROM, PROM, EPROM, EEPROM and Flash memory. Each type having unique characteristics, but they all share store nonvolatile data. That is, it is not lost when power is removed. Data stored in these chips is either unchangeable or requires a special operation to change.

Random access memory (RAM) is another best known form of computer memory. RAM is considered "random access" because you can access any memory cell directly if you know the row and column that intersect at that cell. In the most common form of computer memory, dynamic random access memory (DRAM), a transistor and a capacitor are paired to create a memory cell, which represents a single bit of data. The capacitor holds the bit of information—a 0 or a 1. The transistor acts as a switch that lets the control circuitry on the memory chip read the capacitor or change its state. A capacitor is like a small bucket that is able to store electrons. To store a 1 in the memory cell, the bucket is filled with electrons. To store a 0, it is emptied. The problem with the capacitor's bucket is that it has a leak. In a matter of a few milliseconds a full bucket becomes empty. Therefore, for dynamic memory to work, either the CPU or the memory controller has to come along and recharge all of the capacitors holding a 1 before they discharge. To do this, the memory controller reads the memory and then writes it right back. This refresh operation happens automatically thousands of times per second.

Larger and more complex logic designs in integrated circuits (ICs) lead to demands for more sophisticated testing to ensure fault-free performance of those ICs. In a simple model, testing of an IC can include applying multiple test patterns to the inputs of a circuit and monitoring its outputs to detect the occurrence of faults. Fault coverage indicates the efficacy of the test patterns in detecting each fault in a universe of potential faults. Thus, if a set of test patterns is able to detect substantially every potential fault, then fault coverage approaching 100% has been achieved.

To facilitate better fault coverage and minimize test cost, automatic test pattern generation (ATPG) can be used to generate the minimum set of patterns while providing reasonable fault coverage. Specifically, in deterministic ATPG, each test pattern is designed to test for the maximum number of faults. Alternatively, and more frequently in current, complex ICs, structures can be added to the design that allow the IC to quickly test itself. These built-in self-test (BIST) structures can include various pattern generators, the most typical being a pseudorandom pattern generator. After the patterns generated are propagated through scan chains in the tested design, the outputs are analyzed to determine if a fault is detected. Memory Built-In-Self-Test (MBIST) refers to a system or method operative to generate patterns to test memories embedded in a computing system by itself.

The high level functional blocks in a memory device integrated with a MBIST system 100 are illustrated in FIGS. 1(a) and 1(b). The MBIST system 100 includes BIST module 102 that contains functional blocks such as address/data generators, one or more comparators 104, and a storage device 106 to save failure information, and one or more memory 108 under test. FIG. 1(a) shows a one-BIST-per-memory configuration, wherein each memory module 108 has a BIST module directly incorporated thereto. The BIST module 102 is responsible for generating suitable control, address, and input data to the memory module 108 under test based on predetermined test patterns. The memory under test will respond with suitable outputs in response to such stimulus. The comparator 104 compares the outputs from the memory with expected values. If the outputs do not match with the expected value, the fail code information is stored in the storage device such as a fail code storage module. The fail code information typically includes the test pattern number, pass number, X- and Y-addresses, and bit number.

FIG. 1(b) shows another configuration by using one BIST module 102 to test more than one memory modules. The operation of such a system is the same as the one in FIG. 1(a) except that the control, address, data inputs, and data outputs are passed from the memory module under test through one or more memory that is not under test if necessary to reach the BIST module 102 for testing. Those signals are normally arranged into one or multiple scan chains so that data can be shifted in and out more efficiently.

As the size of the memory device increases, the size of the fail code storage module may be huge. Especially when the defect density is high, memory capacity is large, or many memories are under test, the BIST module itself can be too expensive to be integrated.

As such, desirable in the art of memory designs are improved designs for a MBIST system.

SUMMARY

The present disclosure provides a method and system for conducting built-in-self-test (BIST) in a memory device. After allocating at least one memory segment with a predetermined size in at least one memory module as a test result module, the built-in-self-test is conducted for the memory module without testing the test result module. The test results are stored in the test result module.

The construction and its method of the invention, however, together with additional objects and advantages thereof will be best understood from the following description of specific embodiments when read in connection with the accompanying drawings.

DESCRIPTION

This disclosure provides a method and system to use a part of a memory module under test as a storage device to store test information so that there is no need for installing additional storage device for such conducting BIST, thereby saving device area. The system further comprises a test circuit and a circuit under test is electrically coupled to the test circuit. The circuit under test comprises at least a memory block and/or at least a logic circuit block. The memory block comprises a volatile memory and a non-volatile memory. There are types of memory known as SRAM, DRAM, electrical fuse, ROM, PROM, EPROM, EEPROM, Flash memory, Multilevel nonvolatile memory, Ferroelectric memory, MRAM, and Phase-change nonvolatile memory, each type having unique characteristics. The logic circuit block comprises a combinational circuit and/or a sequential circuit.

Figures 1A, 1B:
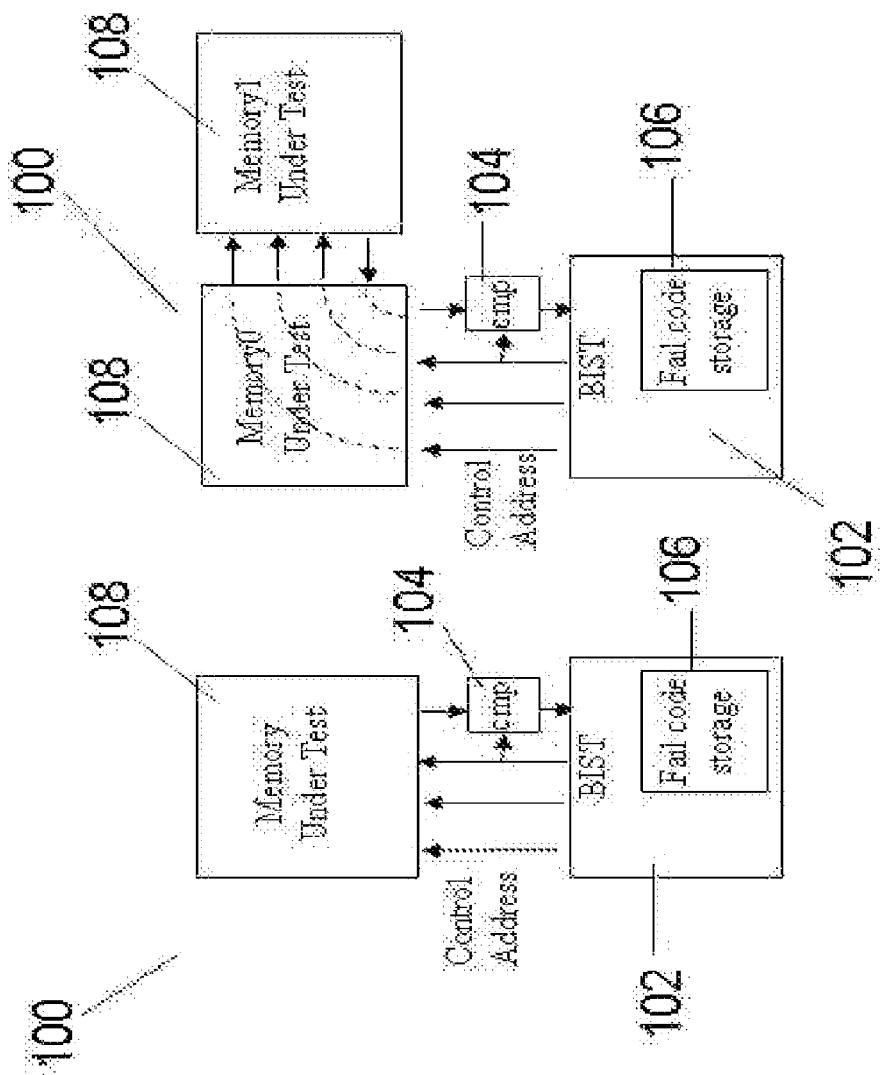
FIGS. 1(a) and 1(b) provide conventional design for memory systems with integrated BIST function.
Figure 2A:
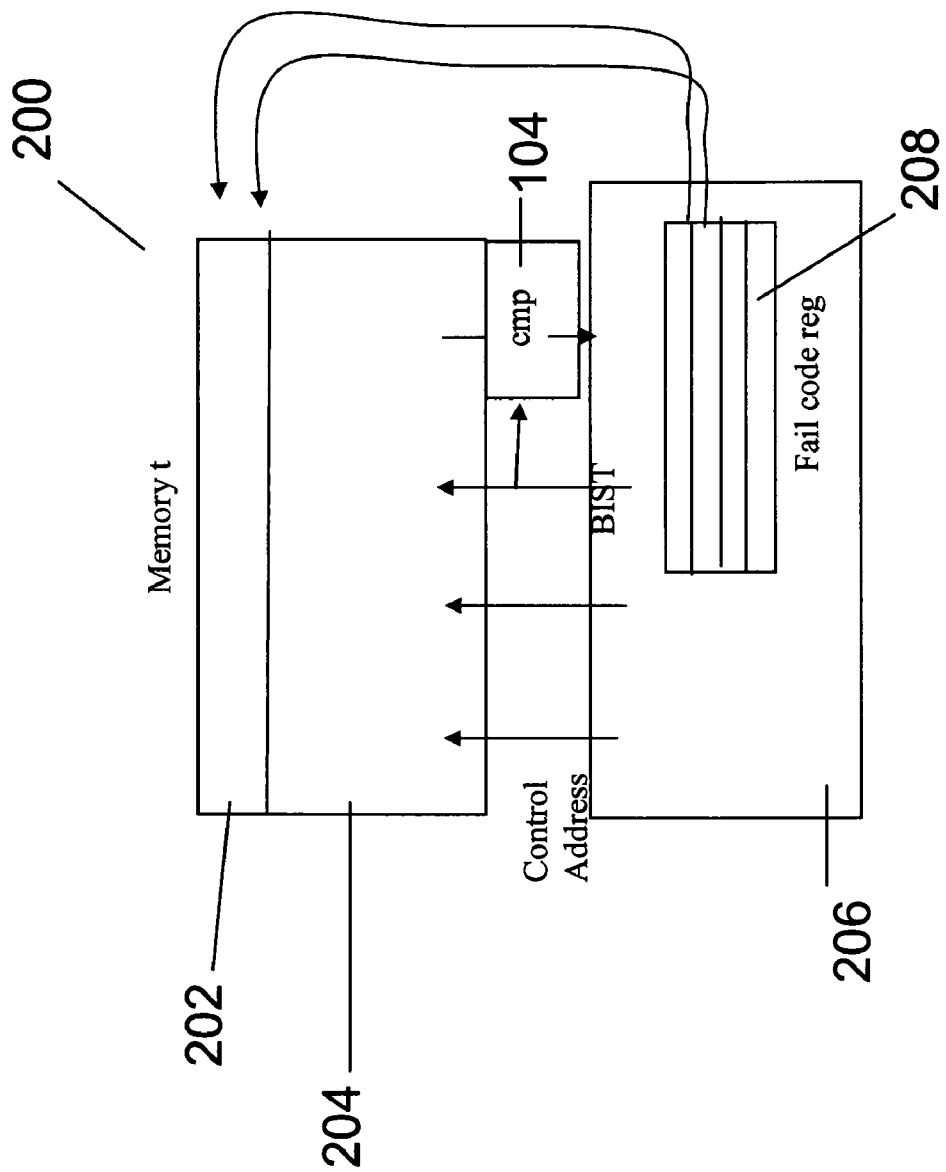
FIGS. 2(a) and 2(b) provide improved design for memory systems with integrated BIST function according to embodiments of the present invention.

FIG. 2(a) shows an improved MBIST system 200 according to one embodiment of the present invention. This is referred to as a one-BIST-one-memory configuration as each memory module has a corresponding BIST module attached thereto. The present invention uses a portion 202 of the memory module 204 for storing test information so that no additional storage device is needed for doing the BIST. For example, a predetermined initial portion of the memory module 202 such as one half of it can be checked first to see whether it is functioning well. If it has any defect, a subportion such as one quarter of the memory module 204 is further tested. The procedure can be continued until a clean and contiguous portion of the memory module that is of a minimum size is found. This space, which can be referred to as a test result module, is then allocated to store test results such as fail codes. Alternatively, a minimum size of the test result module can be determined before hand, and one or more rounds of memory test is conducted for identifying such a test result module. The BIST module 206 contains one or more fail code registers (FCR) 208 that provide pointers to specify the available allocation of the memory space for the test result module 202, i.e., the starting and ending addresses of the memory location etc. It is understood that the memory space reserved for the test result module 202 does not have to be contiguous. They can be in segments in different places of the memory module 204 as long as the FCR 208 provides more pointers to indicate the location and size of these non-contiguous segments.

Once the test result module 202 is identified, in first embodiment, the BIST is a Memory Built-In-Self-Test (MBIST) and the BIST module initiates its test to the entire memory module 204 except that those instructions intending to access the space identified by the test result module are now "masked" and can be changed to No OPeration (NOP) instructions so that the test is not conducted against such memory space. The BIST comprises an at-speed test or a stress-mode test. The stress-mode test comprises an over-drive test or an under-drive test. The BIST module provide test related data such as test pattern, test pattern number, passed or failed vector number, number of I/O bit failure, X- and Y-addresses, bank address, data polarity, addresses to the memory module and force the memory module to produce output data that is used by the comparator to check the test result.

In second embodiment, the BIST is a Logic Built-In-Self-Test (LBIST) and the BIST module initiates its test to a logic circuit block (not shown in the figure) and/or the entire memory module 204 except that those instructions intending to access the space identified by the test result module are now "masked" and can be changed to NOP instructions so that the test is not conducted against such memory space. The BIST comprises an at-speed test or a stress-mode test. The stress-mode test comprises an over-drive test or a under-drive test. The BIST module provide test related data such as failure bits, bit polarity, fail vector, X- and Y-addresses, bank address, data polarity, addresses to the logic circuit block and force the memory module to produce output data that is used by the comparator to check the test result. Expected test results or template of circuit under test comprises ROM or register.

In one embodiment, the FCR itself provides enough space to store failed addresses temporarily before dumping such information into the allocated test result module upon completion of one round of testing. If the test result module is used up due to excessive failure information stored in the allocated space, a flag may be sent to the FCR to stop the test.

Figure 2B:
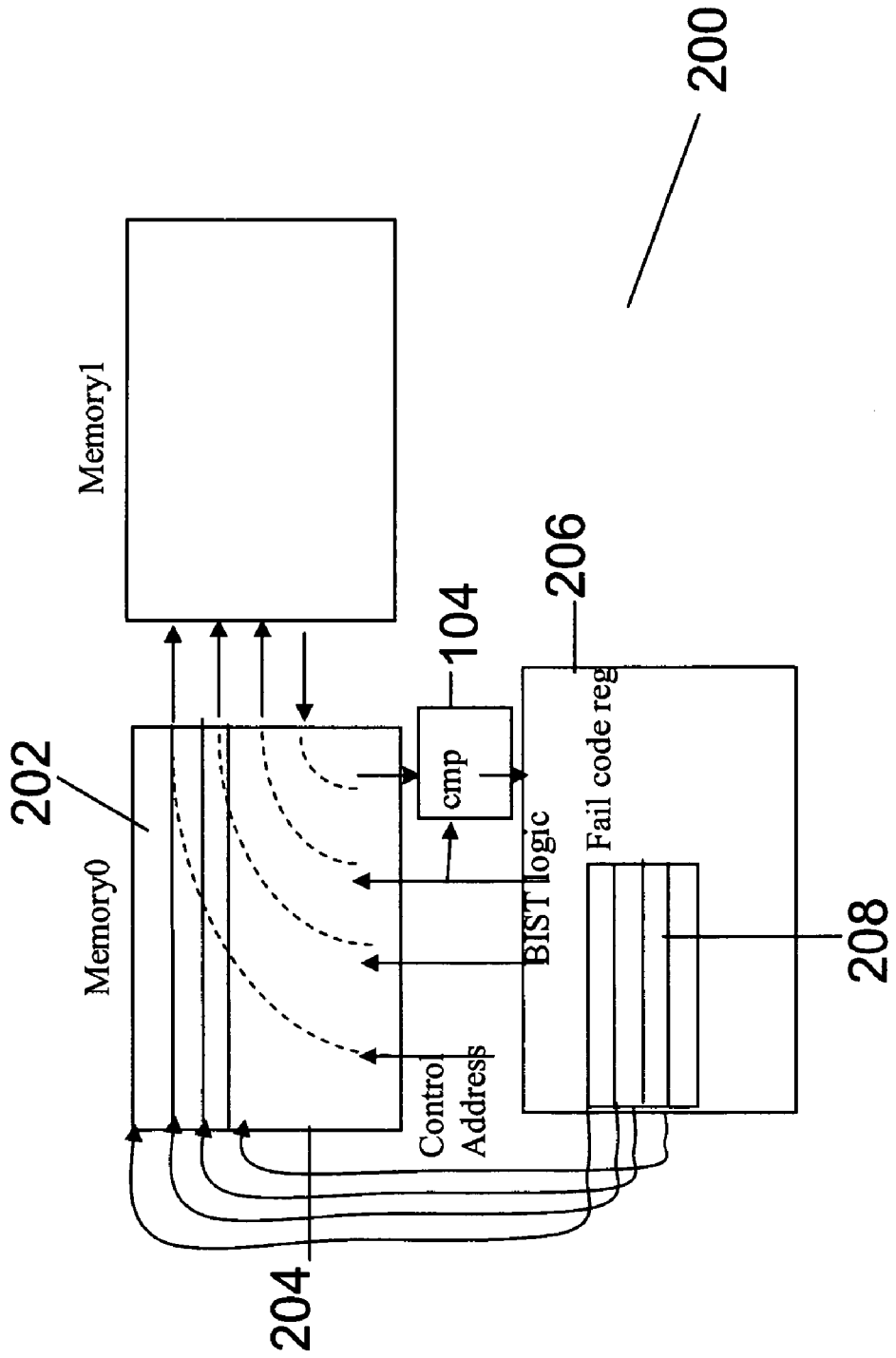

FIG. 2(b) provides a one-BIST-multiple-memory configuration according to another embodiment of the present invention. When using one BIST module for more than one memory module, at least one memory module is selected to allocate some space for the test result module 202. The test result module contains at least the failed addresses of memory cells. The size of the test result module 202 can be flexible or defined dynamically based on the size of the memory module that is going through the BIST. Normally, the smaller the memory size, the fewer the failed addresses are possibly generated, and the smaller the size of the test result module is. Therefore, the size of the test result module can be initially determined as a reasonable minimum, but depending on the number of memory modules that are undergoing the BIST, the test result module can dynamically determine the desired size and expand thereto.

Once a particular memory module is identified so that a portion of it is to be used for the test result module, the memory space is determined as explained above with regard to FIG. 2(a). The memory modules are tested one after another as usual except that when the memory module containing the test result module is under test, the instructions for accessing such space is masked and become NOPs.

The fail code registers (FCRs) inside the BIST module provide pointers to specify the test result information for each memory module under test. The test result information includes, but not limited to, the starting and ending addresses, test pattern, test pattern number, pass or fail result, passed or failed vector number, number of I/O bit failure, X- and Y-addresses, bank address, data polarity, and allocated size for each memory module. As stated above, with the appropriate design of the FCR, the test result module does not have to be a contiguous memory segment, and they can be located in a distributed manner. It is understood that the term memory segment used in this disclosure does not mean any segment of a fixed size. The memory segment can be of any size as long as the starting and ending addresses of which are identified.

Another alternative for allocating space for the test result module is to allocate memory space from more than one memory modules to store the test result information. Further, although FIG. 2(b) illustrates the unique configuration showing the access of one memory module is through another memory module, it is understood that memory modules can be arranged independently, and each of them can communicate with the BIST module separately through a bus without going through another memory module. Further, it is understood at least one logic module can be arranged independently, and each of them can communicate with the BIST module separately through a bus without going through memory module.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for conducting built-in-self-test (BIST) in a circuit under test comprising at least a memory module and a BIST module, the method comprising:
    allocating at least one or more portion of the memory module as a test result module;
    conducting the built-in-self-test for the circuit under test, wherein the BIST module contains one or more fail code registers (FCRs) that provide pointers to specify test result information for each memory module under test; and
    storing test results in the test result module allocated within the memory module of the circuit under test.

2. The method of claim 1, wherein the BIST is a Memory BIST (MBIST).

3. The method of claim 2, wherein the test result information includes a starting address of the test result module.

4. The method of claim 2, wherein the test result information includes an ending address of the test result module.

5. The method of claim 1, wherein the BIST is a Logic BIST (LBIST).

6. The method of claim 5, wherein the test result information includes a starting address of the test result module.

7. The method of claim 5, wherein the test result information includes an ending address of the test result module.

8. The method of claim 1, wherein the circuit under test is electrically coupled to a test circuit.

9. The method of claim 1, wherein the BIST comprises an at-speed test.

10. The method of claim 1, wherein the BIST comprises a stress-mode test.

11. A system with a built-in-self-test (BIST) function, the system comprising:
    a circuit under test including a memory module;
    a test result module allocated within the memory module of the circuit under test for storing test results; and
    a BIST module for conducting the built-in-self-test for the circuit under test, wherein the BIST module contains one or more fail code registers (FCRs) that provide pointers to specify test result information for each memory module under test.

12. The system of claim 11, wherein the memory module comprises a volatile memory.

13. The system of claim 11, wherein the memory module comprises a non-volatile memory.

14. Thee system of claim 11, wherein the test results comprise test pattern number.

15. The system of claim 11, wherein the test results comprise passed or failed vector number.

16. The system of claim 11, wherein the test results comprise number of I/O bit failure.

17. The system of claim 11, wherein the circuit under test comprises at least a logic circuit block.

18. The system of claim 17, wherein the test results of the circuit under test comprises failure bits.

19. The system of claim 17, wherein the test results of the circuit under test comprises bit polarity.

20. The system of claim 17, wherein the test results of the circuit under test comprises fail vector.

* * * * *